(12) United States Patent
Blahnik et al.

(10) Patent No.: US 7,422,653 B2
(45) Date of Patent: Sep. 9, 2008

(54) SINGLE-SIDED INFLATABLE VERTICAL SLIT VALVE

(75) Inventors: Jeff Blahnik, Austin, TX (US); Joe Kraus, Austin, TX (US); Mike Rice, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 424 days.

(21) Appl. No.: 10/890,969

(22) Filed: Jul. 13, 2004

(65) Prior Publication Data

US 2006/0011140 A1    Jan. 19, 2006

(51) Int. Cl.
C23C 16/00 (2006.01)
C23F 1/00 (2006.01)
H01L 21/306 (2006.01)
F16K 3/00 (2006.01)
F16K 25/00 (2006.01)

(52) U.S. Cl. .............. 156/345.32; 156/345.31; 118/719; 118/733; 251/193; 251/326; 251/327; 251/328; 251/329

(58) Field of Classification Search ........... 118/733, 118/719; 156/345.32; 251/326
See application file for complete search history.

(56) References Cited

U.S. PATENT DOCUMENTS

| | | | |
|---|---|---|---|
| 1,524,267 A | 1/1925 | Loop | |
| 4,560,141 A | 12/1985 | Bosch | |
| 4,721,282 A * | 1/1988 | Shawver et al. | 251/62 |
| 4,809,950 A | 3/1989 | Geiser | |
| 4,881,717 A | 11/1989 | Geiser | |
| 4,921,213 A | 5/1990 | Geiser | |
| 5,170,990 A * | 12/1992 | Kamiya et al. | 251/210 |
| 5,226,632 A | 7/1993 | Tepman et al. | |
| 5,271,602 A | 12/1993 | Funaba | |
| 5,275,303 A | 1/1994 | Szalai | |
| 5,363,872 A | 11/1994 | Lorimer | |
| 5,379,983 A | 1/1995 | Geiser | |
| 5,396,919 A | 3/1995 | Wilson | |
| 5,577,707 A | 11/1996 | Brida | |
| 5,579,718 A | 12/1996 | Freerks | |
| 5,626,324 A | 5/1997 | Nakamura et al. | |
| 5,695,564 A | 12/1997 | Imahashi | |
| 5,820,104 A | 10/1998 | Koyano et al. | |
| 5,855,681 A | 1/1999 | Maydan et al. | |
| 5,902,088 A | 5/1999 | Fairbairn et al. | |
| 5,909,867 A | 6/1999 | Blecha | |
| 5,909,994 A | 6/1999 | Blum et al. | |
| 5,961,269 A | 10/1999 | Kroeker | |
| 5,971,358 A | 10/1999 | Kennedy | |
| 5,975,492 A | 11/1999 | Brenes | |
| 6,032,419 A | 3/2000 | Hurwitt | |
| 6,045,620 A | 4/2000 | Tepman et al. | |
| 6,073,655 A | 6/2000 | Thompson et al. | |

(Continued)

*Primary Examiner*—Parviz Hassanzadeh
*Assistant Examiner*—Rakesh K Dhingra
(74) *Attorney, Agent, or Firm*—Patterson and Sheridan

(57) ABSTRACT

A vacuum chamber having a gate valve including a chamber housing defining an internal vacuum region and first and second openings through the chamber housing and a gate valve secured to the chamber housing. The gate valve includes a sealing door located in the processing region and configured to seal the first opening in the chamber housing; a vertical actuator located outside the chamber housing; a one-sided horizontal actuator located within the processing region and connected to the sealing door; and a valve shaft extending through the second opening in the chamber housing and connecting the vertical actuator to the one-sided horizontal actuator.

14 Claims, 6 Drawing Sheets

U.S. PATENT DOCUMENTS

| | | |
|---|---|---|
| 6,079,693 A | 6/2000 | Ettinger et al. |
| 6,082,950 A | 7/2000 | Altwood et al. |
| 6,089,537 A | 7/2000 | Olmsted |
| 6,089,543 A | 7/2000 | Freerks |
| 6,152,070 A | 11/2000 | Fairbairn et al. |
| 6,173,938 B1 | 1/2001 | McAndrew |
| 6,250,869 B1 | 6/2001 | Kroeker |
| 6,308,932 B1 | 10/2001 | Ettinger et al. |
| 6,328,051 B1 | 12/2001 | Maher |
| 6,347,918 B1 | 2/2002 | Blahnik |
| 6,347,919 B1 | 2/2002 | Ryan et al. |
| 6,367,770 B1 | 4/2002 | Duelli |
| 6,409,149 B1 | 6/2002 | Maher, Jr. |
| 6,454,241 B2 * | 9/2002 | Tamura et al. ............... 251/193 |
| 6,461,437 B1 | 10/2002 | Kubota et al. |
| 6,494,670 B2 | 12/2002 | Kroeker |
| 6,517,048 B2 | 2/2003 | Ettinger et al. |
| 6,553,280 B2 | 4/2003 | Johnson et al. |
| 6,568,552 B1 | 5/2003 | Tabrizi et al. |
| 6,591,850 B2 | 7/2003 | Rocha-Alvarez et al. |
| 6,629,682 B2 | 10/2003 | Duelli |
| RE38,318 E | 11/2003 | Brenes |
| 6,647,665 B1 | 11/2003 | Tabrizi et al. |
| 2002/0038528 A1 | 4/2002 | Blahnik |
| 2002/0088959 A1 | 7/2002 | Duelli |
| 2003/0126799 A1 | 7/2003 | Porret et al. |

* cited by examiner

SINGLE-SIDED INFLATABLE VERTICAL SLIT VALVE

BACKGROUND OF THE INVENTION

1. Field of the Invention

Embodiments of the present invention generally relate to gate valves for vacuum chambers, more specifically, slit valves for use in the semiconductor processing industry.

2. Description of the Related Art

Integrated process tools are often used in the semiconductor processing industry to rapidly expose a single substrate to many chemical and mechanical processes. These processes are performed in multiple chambers that are connected by additional transport, storage, and temperature and pressure adjustment chambers. To isolate the chambers during substrate processing, specialized gate valves are used. The gate valves are designed to operate in low pressure and harsh processing conditions and to provide enough of a transfer area to accommodate the substrate support robot or other mechanism that moves a substrate through slits in an integrated processing tool. Gate valves are often designed to reduce friction between components and to reduce formation of contaminating particles.

The slit valves can be designed to reduce friction using sequential vertical and horizontal motion in a fixed, predetermined path. Such valves often utilize cam and slide mechanisms and multiple shafts to place the valve in a closed position. Alternatively, the valve surfaces may travel in a housing and may also contact the housing to provide sufficient force to seal the slit.

The use of contact surfaces and multiple shaft support mechanisms results in additional friction areas that will increase the likelihood of particle generation in the system. Thus, further reducing particle generation can be achieved by improving slit valve design.

SUMMARY OF THE INVENTION

The present invention generally provides a vacuum chamber having a gate valve including a chamber housing defining an internal vacuum region and first and second openings through the chamber housing and a gate valve secured to the chamber housing. The gate valve includes a sealing door located in the internal vacumn region and configured to seal the first opening in the chamber housing, a vertical actuator located outside the chamber housing, a one-sided horizontal actuator located within the internal vacumn region and connected to the sealing door, and a valve shaft extending through the second opening in the chamber housing and connecting the vertical actuator to the one-sided horizontal actuator.

In one embodiment, the one-sided horizontal actuator comprises one or more spring bellows. In another embodiment, the vertical actuator is pneumatically or hydraulically actuated.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
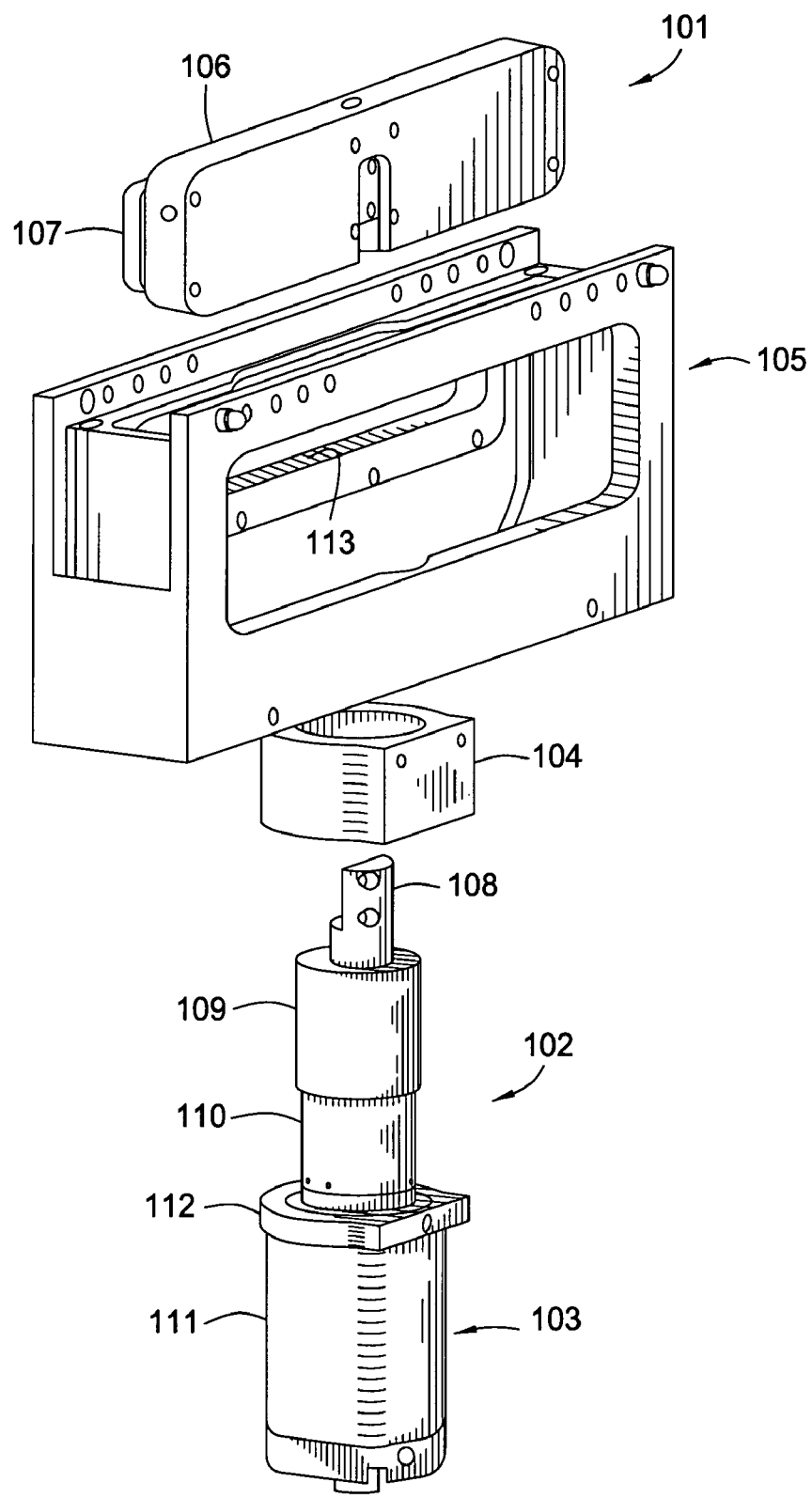
FIG. 1 is an exploded view of one embodiment of a gate valve assembly of the present invention.

FIG. 1 is an exploded view of a gate valve assembly. The gate valve assembly consists of three major parts; a bellows head assembly 101, a shaft assembly 102, and a vertical actuator assembly 103. The gate valve assembly of FIG. 1 includes a mount block 104 that secures to a valve housing 105 that is part of a commercial vacuum chamber. The vertical actuator assembly 103, mount block 104, and valve housing 105 may have pinned connections. For example, the embodiment featured in FIG. 1 shows a valve housing 105 that may be incorporated into a Centura™ transfer chamber, available from Applied Materials, Inc.

The bellows head assembly 101 includes a support block 106 and sealing door 107. The support block 106 is fastened to an end of a valve shaft 108 of the shaft assembly 102. The valve shaft 108 is fastened at the other end to a vertical actuator 111 as described for FIG. 3, and is covered during movement by exterior shaft cover 109 and interior shaft cover 110. The vertical actuator 111 is fastened to a flange 112 that fastens to the mount block 104. The sealing door 107 is configured to engage a slit 113 in the valve housing 105.

Figure 2:
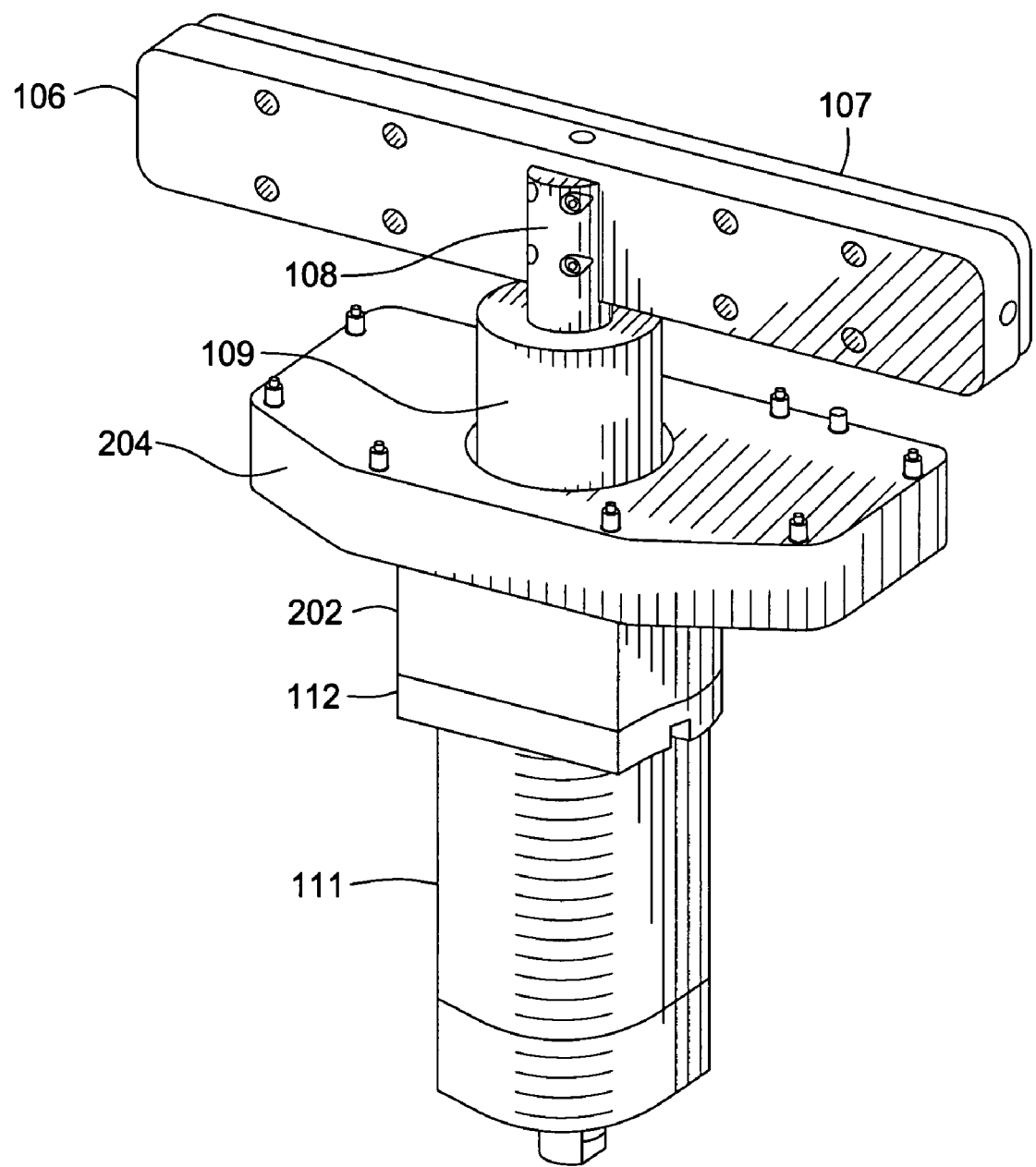
FIG. 2 is a three dimensional view of a second embodiment of a gate valve assembly of the present invention.
Figure 6:
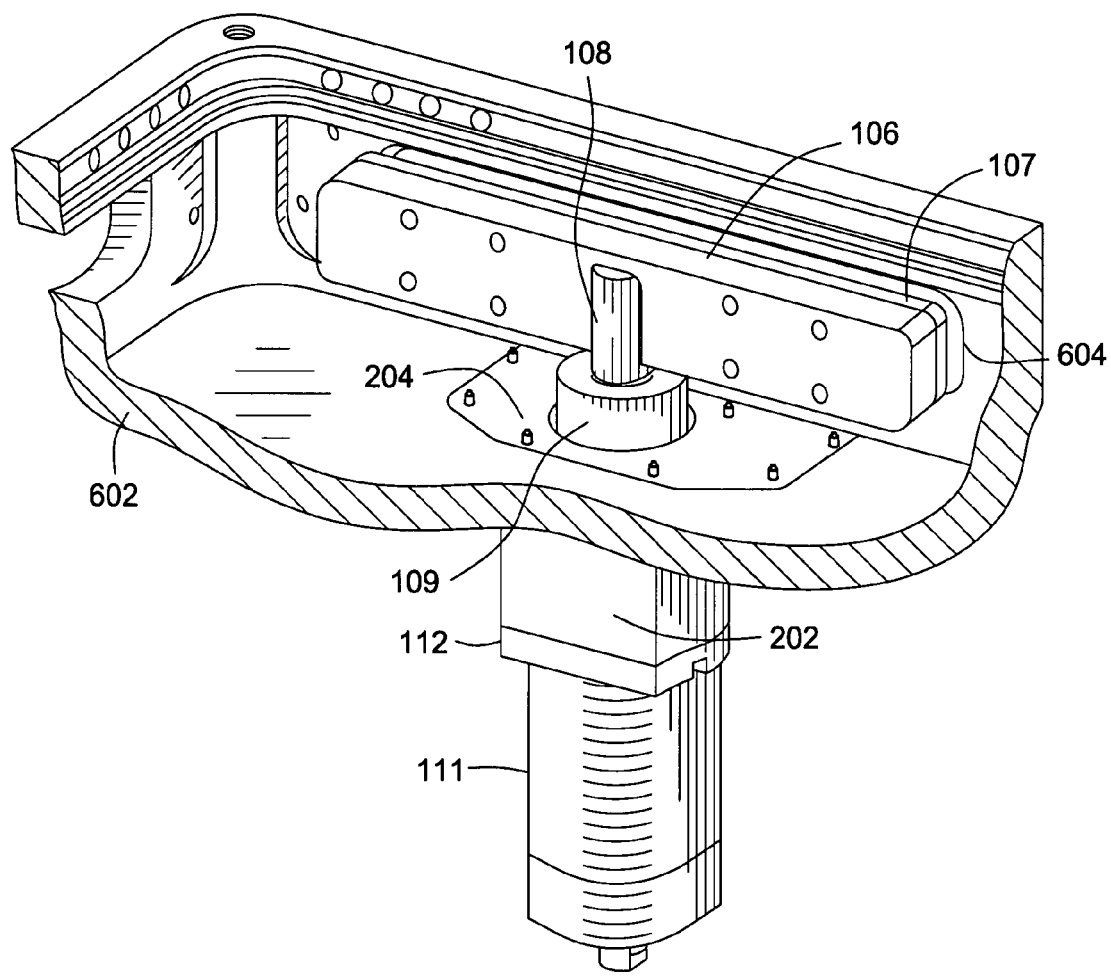
FIG. 6 is a partial view of the gate valve assembly of FIG. 2 within a chamber housing.

FIG. 2 is a three dimensional view of an alternative embodiment of a gate valve that may be incorporated into a Producer™ transfer chamber, available from Applied Materials, Inc. The alternative embodiment includes many of the components described for FIG. 1. However, the valve housing 105 of FIG. 1 is replaced by a mounting collar 204 that fastens to the transfer chamber 602 as shown in FIG. 6. Below the mounting collar 204, a mount block 202 connects the flange 112 to the mounting collar 204.

Figure 3:
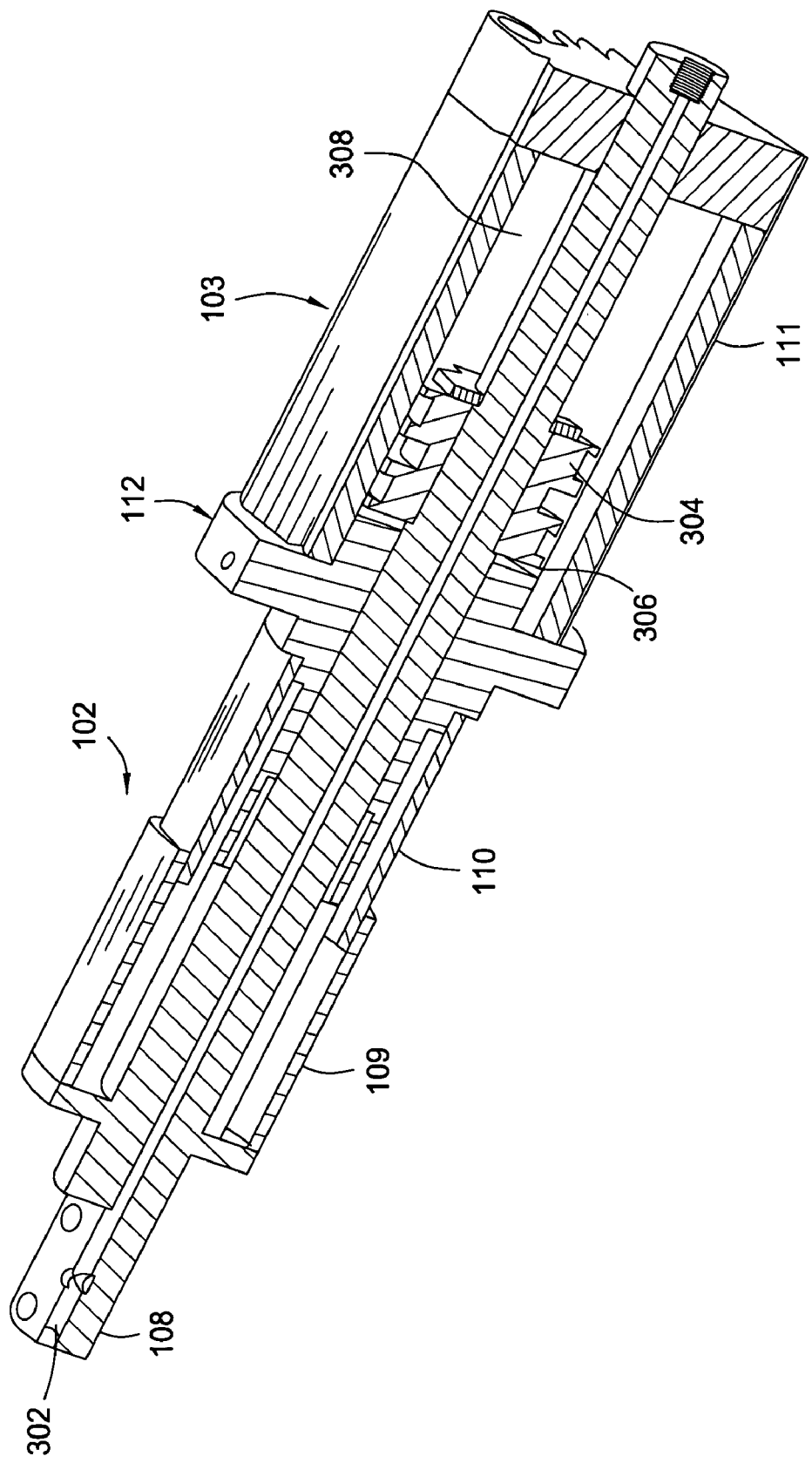
FIG. 3 is a three dimensional view of a shaft and vertical actuators used in the embodiments shown in FIGS. 1 and 2.

FIG. 3 is a sectional three dimensional view of the shaft assembly 102 and vertical actuator assembly 103 shown in FIGS. 1 and 2. A gas channel 302 allows gas from a first gas source (not shown) to flow through the valve shaft 108 to the bellows head assembly 101 shown in more detail in FIG. 4. An actuator seal 304 is secured to the valve shaft 108 within the vertical actuator 111. The vertical actuator 111 contains an upper pneumatic chamber 306 and a lower pneumatic chamber 308 that surround the actuator seal 304. A second gas source (not shown) alternatively pressurizes the upper pneumatic chamber 306 or the lower pneumatic chamber 308 to raise or lower the valve shaft 108.

Figure 4:
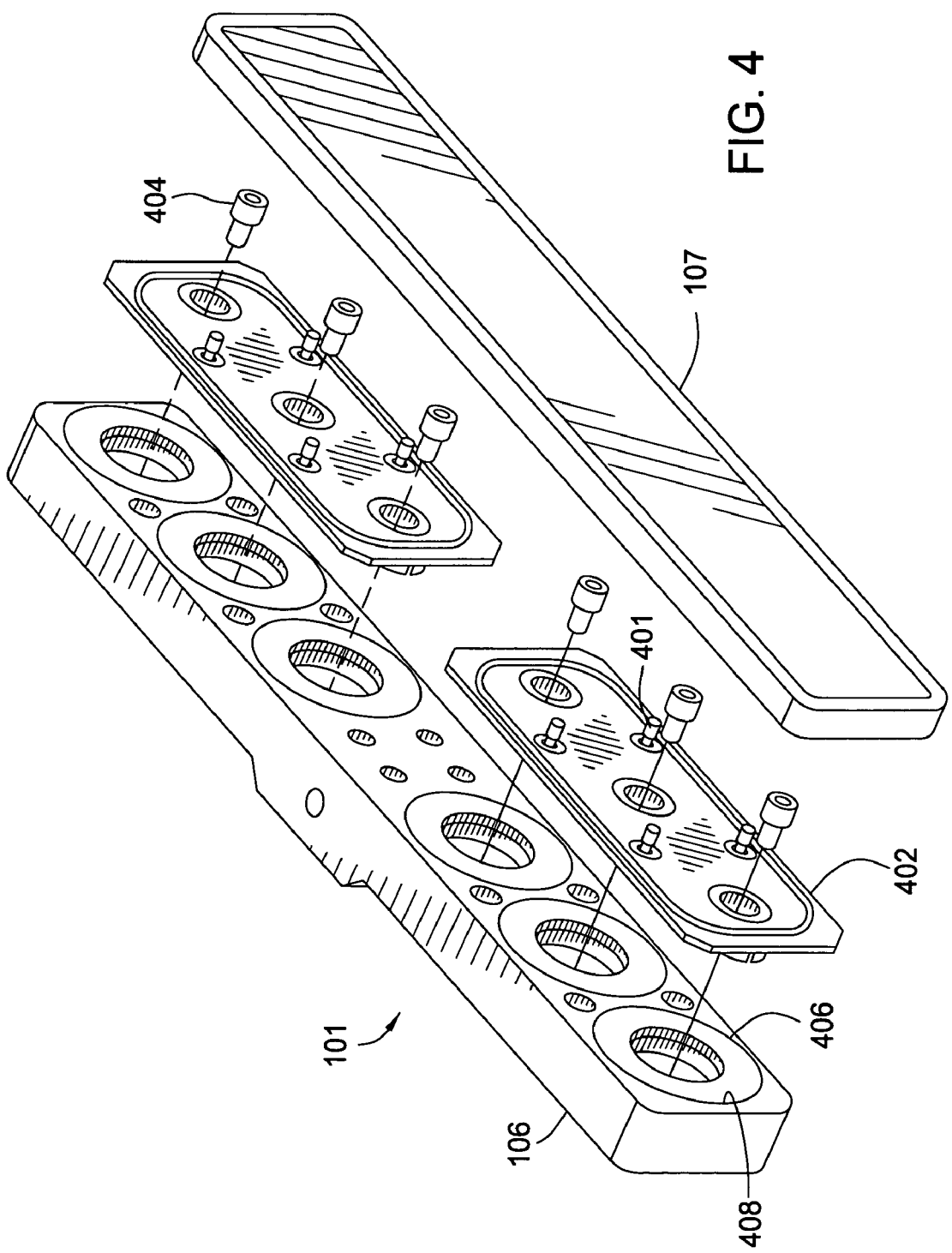
FIG. 4 is an exploded view of a one-sided horizontal actuator used in the embodiments shown in FIGS. 1 and 2.

FIG. 4 is an exploded view of the bellows head assembly 101. The sealing door 107 is connected by screws 401 to two bellows end plates 402. Screws 404 connect the bellows end plates 402 to six stainless steel spring bellows 406 that are puck welded into pockets 408 in the support block 106.

Figure 5:
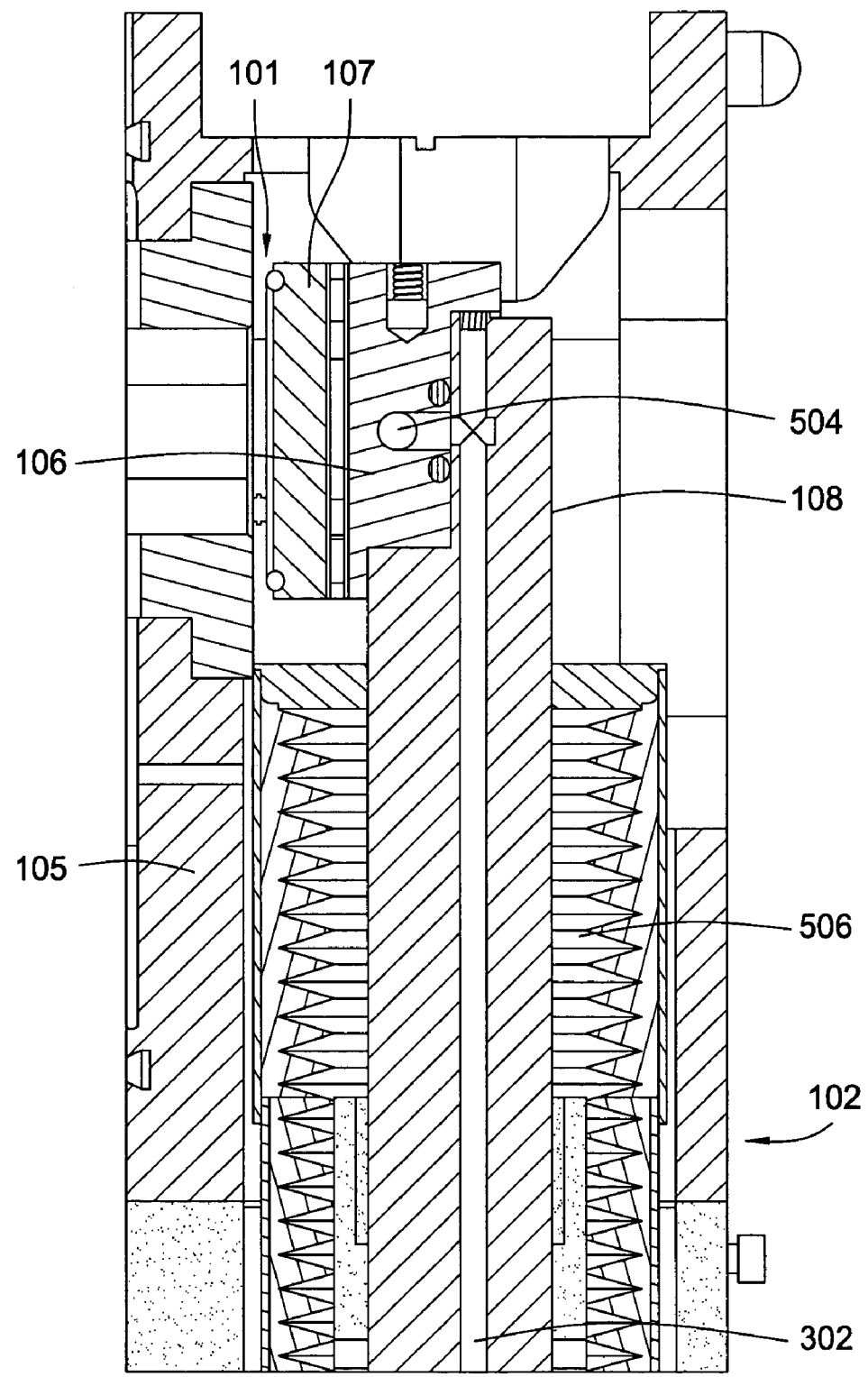
FIG. 5 is a cross sectional view of a portion of the gate valve assembly of FIG. 1 in the up, but not clamped position.

FIG. 5 is a sectional view of the bellows head assembly 101 and the shaft assembly 102 of FIG. 1. The valve shaft 108 is in the raised position, however, the valve housing 105 is not in contact with the sealing door 107 because the spring bellows 406 (FIG. 4) are retracted when the gas channel 302 is not pressured by the first gas source (not shown). When gas channel 302 is pressurized, the gas also pressurizes the bellows supply channel 504 located in the support block. A flexible bellows housing 506 surrounds a portion of the valve shaft 108 that retracts into vertical actuator assembly 103 (FIG. 1) to reduce particle contamination and seal against vacuum.

FIG. 6 is a three dimensional view of the embodiment shown in FIG. 2 attached to the transfer chamber housing 602 of the Producer™ integrated processing tool available from Applied Materials of Santa Clara, Calif. The mounting collar 204 is configured to secure to the transfer chamber housing 602. The sealing door 107 is configured to seal a slit 604 in the transfer chamber housing 602. The support block 106, valve shaft 108, and exterior shaft cover 109 are made from materials that are compatible with the transport regions of the integrated processing tool. The external portion of the mount block 202, the flange 112, and the vertical actuator 111 are not located within the processing or transport regions of the integrated processing tool.

In operation, the spring bellows 406 are commonly controlled so that when they are pressurized, the control scheme forces the spring bellows 406 to expand evenly. When the spring bellows 406 expand, the bellows end plates 402 move the sealing door 107 to close the valve. When expanded, the spring bellows 406 compensate for any slight misalignment of the sealing door 107 with the valve housing 105 (FIG. 6). When the gas pressure to the spring bellows 406 is released, the spring bellows 406 retract. Thus, the spring bellows 406 eliminate the need for complex cam or slide-based mechanisms or secondary retract springs.

The bellows head assembly 101 and vertical actuator assembly 103 shown in FIGS. 1 and 2 may be pneumatically or hydraulically actuated. Independent horizontal and vertical motions combine to seal the valve for vacuum or other demanding processing environments with minimal contamination. Nitrogen, helium, oxygen, or air may be used for supplying pressurized gas. Preferably, nitrogen may be used.

While the foregoing is directed to embodiments of the present invention, other and further embodiments of the invention may be devised without departing from the basic scope thereof, and the scope thereof is determined by the claims that follow.

The invention claimed is:

1. A vacuum chamber having a gate valve, comprising:
   a chamber housing defining an internal vacuum region and first and second openings through the chamber housing; and
   a gate valve secured to the chamber housing, the gate valve comprising:
      a sealing door located in the internal vacuum region and configured to seal the first opening in the chamber housing;
      a vertical actuator located outside the chamber housing;
      a one-sided horizontal actuator located completely within the internal vacuum region and connected to the sealing door, wherein the one-sided horizontal actuator is configured to move independently of the vertical actuator to seal the first opening in the chamber housing; and
      a valve shaft extending through the second opening in the chamber housing and connecting the vertical actuator to the one-sided horizontal actuator.

2. The vacuum chamber of claim 1, wherein the one-sided horizontal actuator comprises spring bellows.

3. The vacuum chamber of claim 1, wherein the vertical actuator comprises a housing that defines two pneumatic chambers surrounding an actuator seal secured to the valve shaft.

4. The vacuum chamber of claim 3, wherein the one-sided horizontal actuator comprises spring bellows.

5. The vacuum chamber of claim 1, wherein the vertical actuator is hydraulically actuated.

6. The vacuum chamber of claim 1, wherein the vertical actuator is pneumatically actuated.

7. A vacuum chamber having a gate valve, comprising:
   a chamber housing defining an internal vacuum region and first and second openings through the chamber housing; and
   a gate valve secured to the chamber housing, the gate valve comprising:
      a sealing door located in the internal vacuum region and configured to seal the first opening in the chamber housing;
      a vertical actuator located outside the chamber housing;
      a one-sided horizontal actuator located completely within the internal vacuum region and connected to the sealing door, wherein the one-sided horizontal actuator comprises spring bellows; and
      a valve shaft extending through the second opening in the chamber housing and connecting the vertical actuator to the one-sided horizontal actuator, the valve shaft comprising a gas channel in fluid communication with the spring bellows, wherein the one-sided horizontal actuator is configured to move independently of the vertical actuator to seal the first opening in the chamber housing.

8. The vacuum chamber of claim 7, wherein the vertical actuator comprises a housing that defines two pneumatic chambers surrounding an actuator seal secured to the valve shaft.

9. The vacuum chamber of claim 7, wherein the vertical actuator is hydraulically actuated.

10. The vacuum chamber of claim 7, wherein the vertical actuator is pneumatically actuated.

11. A vacuum chamber having a gate valve, comprising:
    a chamber housing defining an internal vacuum region and first and second openings through the chamber housing; and
    a gate valve secured to the chamber housing, the gate valve comprising:
       a sealing door located in the internal vacuum region and configured to seal the first opening in the chamber housing;
       a vertical actuator located outside the chamber housing, wherein the vertical actuator comprises a housing that defines two pneumatic chambers surrounding an actuator seal;
       a one-sided horizontal actuator located completely within the internal vacuum region and connected to the sealing door, wherein the one, sided horizontal actuator comprises spring bellows, bellows end plates, and a support block; and
       a valve shaft extending through the second opening in the chamber housing and connecting the actuator seal to the one-sided horizontal actuator,
       the valve shaft having a gas channel in fluid communication with the spring bellows, wherein the one-sided horizontal actuator is configured to move independently of the vertical actuator to seal the first opening in the chamber housing.

12. The vacuum chamber of claim 11, wherein the support block comprises six spring bellows pockets and the one-sided horizontal actuator comprises six spring bellows.

13. The vacuum chamber of claim 12, wherein the spring bellows are welded into the spring bellows pockets.

14. The vacuum chamber of claim 13, wherein the bellows end plates are connected to the sealing door with screws.

* * * * *